United States Patent [19]
Freiberger et al.

[11] Patent Number: 5,389,581
[45] Date of Patent: Feb. 14, 1995

[54] HIGH DENSITY TEOS-BASED FILM FOR INTERMETAL DIELECTRICS

[75] Inventors: Philip Freiberger, Santa Clara; Ragupathy V. Giridhar, San Jose; Brett Huff, Fremont; Farhad K. Moghadam, Los Gatos, all of Calif.

[73] Assignee: Intel Corporation, Santa Clara, Calif.

[21] Appl. No.: 67,335

[22] Filed: May 25, 1993

Related U.S. Application Data

[63] Continuation of Ser. No. 712,115, Jun. 7, 1991, abandoned.

[51] Int. Cl.$^6$ .............................................. H01L 21/90
[52] U.S. Cl. .................... 437/238; 437/195; 437/240
[58] Field of Search ............... 437/195, 235, 238, 240; 148/DIG. 118; 357/71

[56] References Cited

U.S. PATENT DOCUMENTS

| | | | |
|---|---|---|---|
| 4,892,753 | 1/1990 | Wang et al. | 427/38 |
| 5,013,691 | 5/1991 | Lory et al. | 437/238 |
| 5,246,887 | 9/1993 | Yu | 437/238 |
| 5,270,264 | 12/1993 | Andiden et al. | 437/238 |

OTHER PUBLICATIONS

Nguyen et al., J. Vac. Sci. Technol. B 8(3) May/Jun. 1990, pp. 533–539.
Nguyen et al., J. Electrochem. Soc. vol. 137, No. 7, Jul. 1990, pp. 2209–2215.
Pai et al., J. Appl. Phys. 68(2) 15 Jul. 1990, pp. 793–801.
Suzuki et al., Jap. J. Appl. Physics vol. 29, No. 12, Dec. 1990, pp. L2341–L2344.
Mehta, et al.; "A Single-Pass, In-Situ Planarization Process Utilizing TEOS for Double-Poly, Double--Metal CMOS Technologies"; IEEE 6th Int'l VMIC Conf.; Jun. 1989; pp. 80–88.
Marks, et al.; "In Situ Planarization of Dielectric Surfaces Using Boron Oxide"; IEEE 6th Int'l VMIC Conf.; Jun. 1989; pp. 89–95.

*Primary Examiner*—Olik Chaudhuri
*Assistant Examiner*—Ken Horton
*Attorney, Agent, or Firm*—Blakely, Sokoloff, Taylor & Zafman

[57] ABSTRACT

A method of forming a device and the device itself that utilizes a high density plasma-enhanced TEOS-based intermetal dielectric is disclosed. The high density is accomplished though the use of higher RF power and higher oxygen flow rate so that the TEOS is more completely oxidized. The higher density intermetal dielectric absorbs water from air slower than a standard intermetal dielectric film. This lower water absorbance reduces the amount of water in the device and reduces hot electron induced device degradation.

13 Claims, 3 Drawing Sheets

SUBSTRATE 101

SUBSTRATE 101

SUBSTRATE 101

HIGH DENSITY TEOS-BASED FILM FOR INTERMETAL DIELECTRICS

This is a continuation of application Ser. No. 07/712,115, filed Jun. 7, 1991, now abandoned.

FIELD OF THE INVENTION

The present invention relates generally to the field of processing semiconductor devices, and in particular, to the formation of a more conformal, high density intermetal dielectric (IMD) film on semiconductor substrates containing such devices.

BACKGROUND OF THE INVENTION

Metal oxide semiconductor (MOS) technology is used to form a number of different types of devices which include semiconductor memory devices dependent on hot electron programming. When programming one type of these devices, hot electrons are injected from the drain through the tunnel dielectric and into the floating gate. As such, hot electrons are present during programming and do not give rise to any adverse effects. On the other hand, when a high hot electron concentration occurs in a MOS transistor, several problems can arise including hot electron induced device degradation. Hot electrons may have sufficient energy to damage the substrate-gate dielectric interface near the drain edge that may cause to adverse changes in the transistor characteristics.

Certain types of intermetal dielectrics have been found to cause problems with hot electrons at the substrate-gate dielectric interface near the drain. An intermetal dielectric (IMD) film typically absorbs ambient moisture and when the device is passivated, the moisture is trapped. Subsequent heat cycles may drive the moisture into the gate oxide region. In the prior art, the hot-electron susceptibility of transistors using wet gate oxides is known to be inferior to those of transistors using dry chlorinated gate oxides. Therefore, water absorbed into the IMD film could migrate to the gate dielectric thereby making a device more susceptible to hot electron induced device degradation.

A number of prior art attempts have not yielded adequate results, one of which includes placing a moisture barrier in the form of gate sidewall spacers comprised of a material such as silicon nitride near the gate of the device. Silicon nitride causes device instability because hot electrons are trapped in the silicon nitride and near the gate.

Another prior an attempt minimizes the exposure of the IMD film to air between the steps of IMD film deposition and passivation deposition. This processing sequence has serious drawbacks in a manufacturing environment because it is typically difficult to guarantee that the equipment used for subsequent steps would be available immediately following the IMD deposition. As such, a sufficiently short queue time between IMD deposition and passivation deposition which is typically a few processing steps later in the process flow has proven to be impractical.

A higher density IMD film is desired so that the moisture absorption rate of the film is reduced (compared to a lower density IMD film). A few prior art attempts at making such a film have proven to be inadequate in one or more ways. An undoped, silane-based film is highly nonconformal and causes step coverage problems particularly with state-of-the-art devices having step heights greater than one micron ($\mu m$). Some problems with nonconformal IMD films are addressed in an article entitled "A Single Pass, In-Situ Polarization Process Utilizing TEOS for Double-Poly, Double-Metal, CMOS Technologies" by Mehta, et al. from the IEEE Sixth International VLSI Multilevel Interconnection Conference in June 1989.

The concepts of conformal and nonconformal films as well as problems with the latter are illustrated in FIGS. 1–6. FIG. 1 is an illustration of a film that is conformal. The substrate 101 has a planar surface with metal lines 102 which are about 1 $\mu m$ wide and 1 $\mu m$ high and are spaced about 1.1 $\mu m$ apart. The conformal film 103 follows the exposed topography of the combination of substrate 101 and metal lines 102 very well. FIG. 2 illustrates a nonconformal film deposited over a substrate-metal topography similar to FIG. 1. The nonconformal film 203 produces a film with a reentrant angle $\beta$ as illustrated in FIG. 2. A nonconformal film has localized areas where the etch rate of the film is higher at the corners due to higher film stress at the corners of the film. Because of the reentrant angle, chemicals could remain within the grooves 204 that are near the intersection of the substrate 101 and metal lines 102. Further deposition of the nonconformal film 303 could create a "void" 304 between the metal lines 102 as shown in FIG. 3.

FIG. 4 shows a material 404 such as metal sputtered over the nonconformal film 203 yielding localized areas of discontinuity 405 thereby causing open circuits. FIG. 5 illustrates a conformal film 504 deposited over the nonconformal layer 203. A subsequent anisotropic plasma etch of the conformal film 504 results in residual sections which are not etched due to the directional nature of the anisotropic plasma etch. The residual sections are referred to as "stringers" 604 which are shown in FIG. 6. Stringers are not desired since they can cause circuits within the device to become shorted to one another or react with other layers within the device. Nonconformal films are not desired because they may create a device that is not functional or less reliable.

A prior art attempt to form a more conformal IMD film includes using very heavily doped silicon dioxide films, such as boron oxide as described in an article entitled "In Situ Planarization of Dielectric Surfaces Using Boron Oxide" by Marks, et al. from the *IEEE Sixth International VLSI Multilevel Interconnection Conference* in June 1989. The heavy doping from these films is not desired as these dopants could migrate from the IMD film to the underlying devices. In addition, the dopant could spew from the walls of a subsequently formed opening in the IMD film and react with material that fills the opening or with other layers that are in contact with the opening.

Unlike undoped, silane-based dielectric layers, a TEOS-based (TEOS is tetraethyl orthosilicate) dielectric film is significantly more conformal. In the absence of a plasma, TEOS deposition by thermal decomposition is typically done at temperatures between 700° C. and 900° C. These high temperatures could melt many metals used in semiconductor devices such as aluminum, and therefore, a plasmaless TEOS-based dielectric cannot typically be used as an IMD film.

Another prior art attempt uses a standard plasma-enhanced TEOS-based IMD film (standard IMD film) that produces a low density film. By low density, it is meant that the HF etch rate of standard IMD film is approximately 1.9 to 2.8 times higher than the HF etch rate of silicon dioxide thermally grown from monocrystalline silicon (hereinafter referred to as thermally grown oxide). A standard plasma-enhanced TEOS process forms a low density IMD film which absorbs water at a fast rate. A lower density IMD film is more susceptible to hot electron induced device degradation than a higher density IMD film.

Throughout this application, comparisons of the IMD film densities are given as a relative HF etch rate (hereinafter referred to as relative HF etch rate) which is the HF etch rate of an IMD film divided by the HF etch rate of thermally grown oxide when a similar HF etching solution is used to etch both the IMD film and the thermally grown oxide. Relative HF etch rates provide a better comparison of the density rather than an absolute HF etch rate since the possible mixtures of HF etching solutions are unlimited.

SUMMARY OF THE INVENTION

In view of the foregoing, it is the principal object of the present invention to produce a semiconductor device which has a more conformal, undoped intermetal dielectric film that absorbs water at a reduced rate compared to a standard intermetal dielectric film, and therefore, produces a device having less hot electron induced device degradation.

It is yet another object of the present invention to reduce hot electron induced device degradation without significantly changing the design of the device.

It is a further object of the present invention to reduce hot electron induced device degradation while maintaining an uncomplicated and reliable manufacturing process.

As will be described in more detail hereinafter, the present invention includes producing a plasma-enhanced, TEOS-based dielectric layer preferably with high radio frequency (RF) power between 450 and 500 watts and a predetermined flow rate of a certain chemical such that the chemical flow rate is at least $\frac{2}{3}$ of the TEOS flow rate on a mole basis. The dielectric film is formed between two different interconnecting layers. The dielectric film formed in accordance with the present invention is more conformal and absorbs water from air at a reduced rate thereby producing a device with less hot electron induced device degradation compared to a device with a standard intermetal dielectric film. A device produced in accordance with the present invention has less device degradation due to hot electrons.

The method of the present invention includes providing a substrate with a first interconnection layer. After the frost interconnection layer is formed on the substrate, the dielectric layer is formed according to the present invention by using a plasma-enhanced reaction with a first flow rate of TEOS (tetraethyl orthosilicate) and a second flow rate of a chemical, such as oxygen. The second flow rate, on a molar basis, is typically less than $\frac{2}{3}$ of the first flow rate. This dielectric layer is formed in a high power (e.g. 450–500 watts) radio frequency field which has a frequency of approximately 13.56 MHz. This dielectric layer is then patterned using well known lithographic techniques for a silicon dioxide, silicon oxynitride, or silicon nitride layer. After this dielectric layer is formed and patterned, a second interconnection layer is formed over the dielectric layer; this second interconnection layer is typically a metal. Further well-known processing steps to produce finished devices are then performed.

DETAILED DESCRIPTION OF THE PRESENT INVENTION

The invention disclosed herein is directed to a method of forming a more conformal, undoped, TEOS-based (TEOS is tetraethyl orthosilicate), high density intermetal dielectric (HD IMD) film and the device itself having an intermetal dielectric (IMD) film with a reduced ambient moisture absorbance rate. The invention can be used to form dielectric layers between any conductive layers (such as polysilicon, silicide, barrier layers, metals, and other conductive interconnection materials) on a semiconductor substrate. In the following description, numerous details are set forth, such as specific materials, processing parameters, etc., in order to provide a thorough understanding of the present invention. It will be obvious, however, to one skilled in the art that these specific details need not be employed to practice the present invention. In other instances, well-known processing steps are not described in detail in order not to unnecessarily obscure the present invention.

The method of the present invention forms a TEOS-based intermetal dielectric film which is more conformal, undoped, and has a higher density than a standard IMD film as previously described. The HD IMD film formed in accordance with the present invention absorbs less moisture during a given time period thereby reducing hot electron induced device degradation. A queue time between the deposition of the HD IMD film and the passivation layer can be lengthened relative to the standard IMD film processing sequence since the HD IMD film absorbs water at a reduced rate. By reducing the amount of water which is absorbed by using the HD IMD film, hot electron induced device degradation is reduced. Data collected on the HD IMD film made in accordance with the present invention indicates that hot electron degradation within a n-channel MOS transistor is reduced compared to a similar transistor using the standard IMD film as determined by measuring the peak transconductance of the transistors before and after stressing the transistor. In the preferred embodiment, the present invention is used with 0.8 $\mu$m technology devices, yet, in alternative embodiments, the present invention can be used on devices manufactured using technologies other than 0.8 μm. Having described the general principles involved with the invention, discussion is now directed to the method of forming the HD IMD film as described immediately below.

Figure 1:
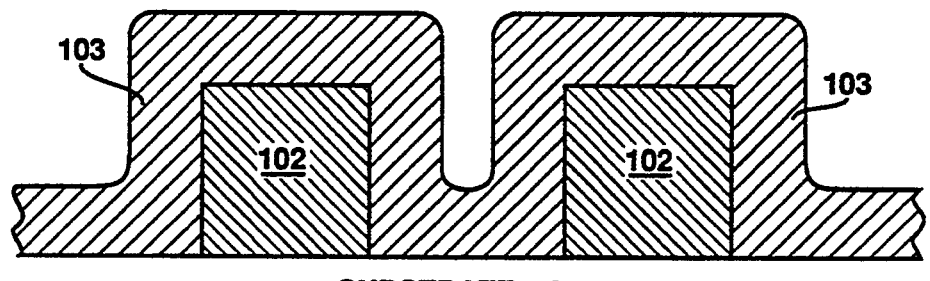
FIG. 1 is an illustration of a conformal film which is deposited on a device having varying step heights.
Figure 2:
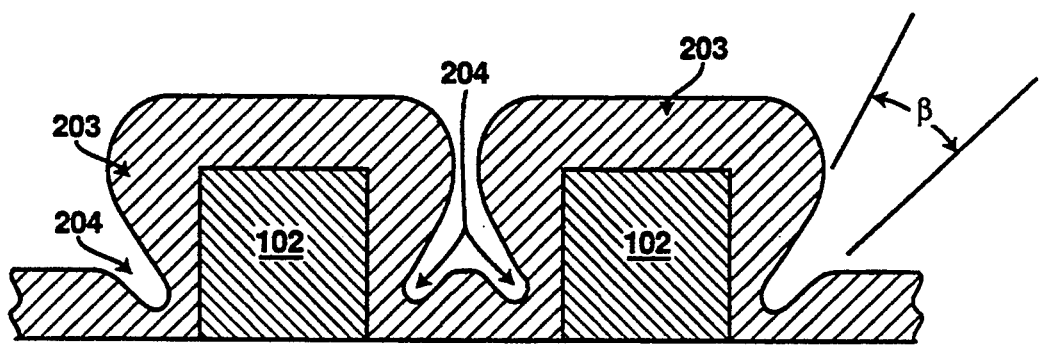
FIG. 2 is an illustration of a nonconformal film which is deposited on a device having varying step heights similar to FIG. 1.
Figure 3:
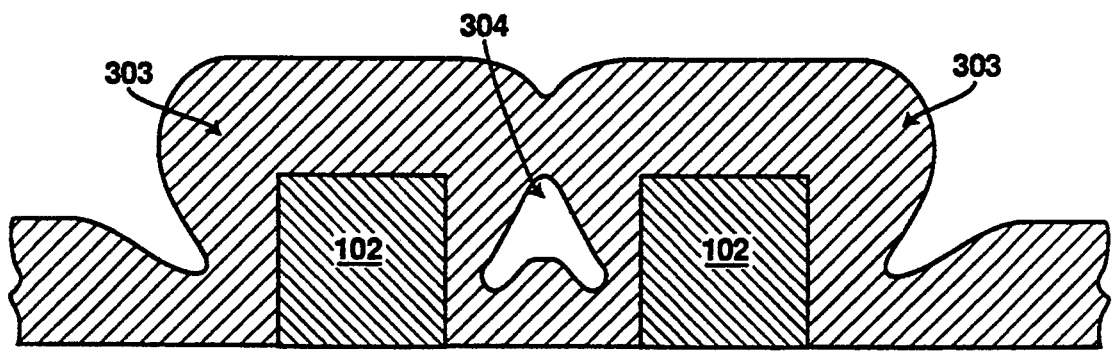
FIG. 3 is the same film in FIG. 2 after further deposition of the nonconformal film.
Figure 4:
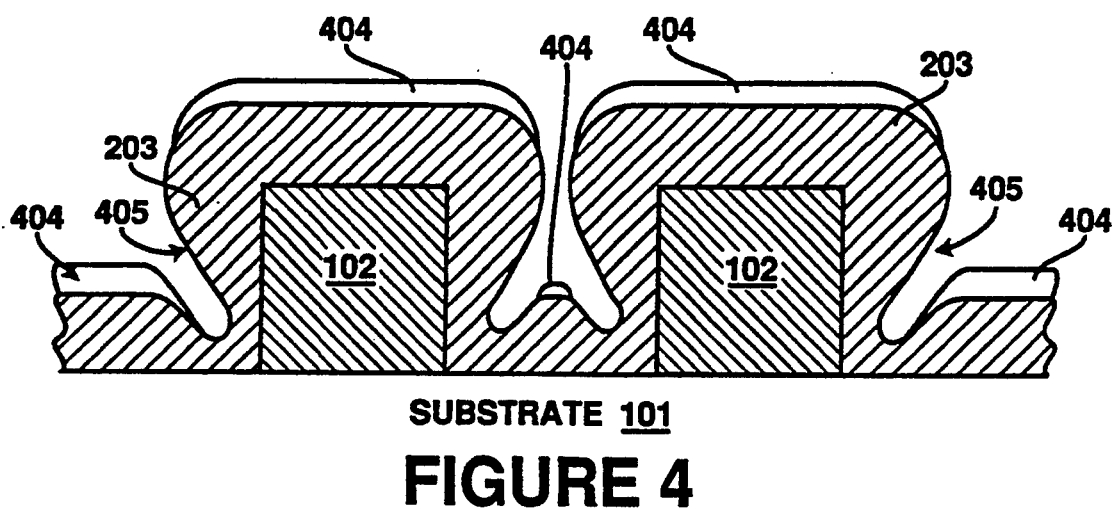
FIG. 4 illustrates the profile of a material sputtered onto the device as shown in FIG. 2.
Figure 5:
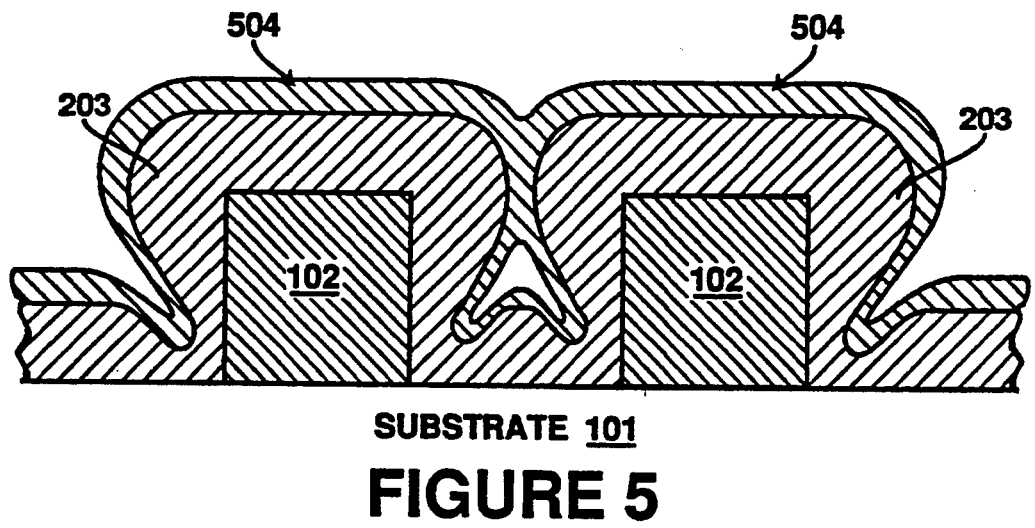
FIG. 5 illustrates the profile of a conformal film deposited over the device as shown in FIG. 2.
Figure 6:
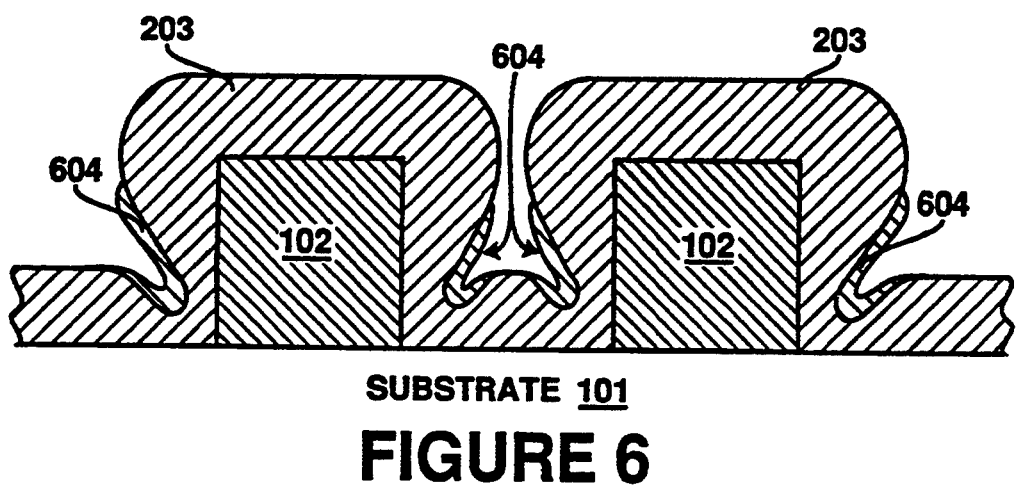
FIG. 6 illustrates where stringers are formed after the device in FIG. 5 is anisotropically etched.
Figure 7:
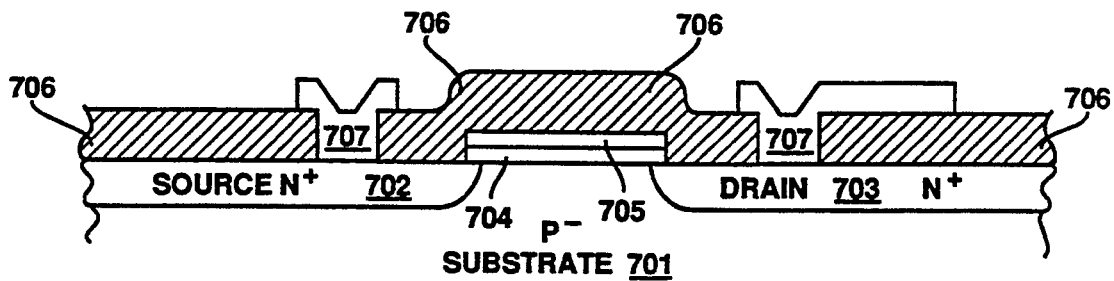
FIG. 7 shows a metal oxide semiconductor device with a first metal layer prior to the formation of the intermetal dielectric layer.

FIG. 7 illustrates a MOS device before the formation of the HD IMD layer made in accordance with the present invention. During the early portion of the processing steps, the MOS device is formed by steps well known in the art. The substrate 701 is a lightly p-type doped monocrystalline material. A source 702 and drain 703 are heavily doped with a n-type dopant and are formed within the monocrystalline material. A gate dielectric 704 and gate electrode 705 lie above the substrate and the ends of both extend slightly over a portion of both the source 702 and the drain 703. The gate dielectric 704 is usually made of high quality silicon dioxide, and the gate electrode 705 is usually made of heavily doped polycrystalline silicon (polysilicon) which may be subsequently silicided. A patterned pre-metal dielectric layer 706 is formed over the device. The pre-metal dielectric layer 706 is usually made of chemically deposited silicon dioxide doped with boron and phosphorus. A first metalization layer 707 is formed and makes contact to predetermined areas of the substrate. As illustrated, the first metalization layer 707 makes contact to the source 702 and drain 703. All of the steps prior to the formation of the HD IMD film are well known in the prior art.

Figure 8:
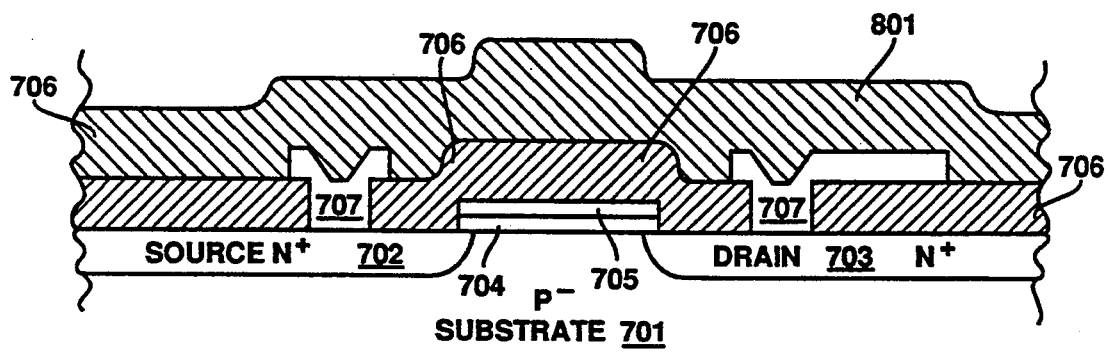
FIG. 8 is an illustration of the substrate in FIG. 7 after forming an intermetal dielectric made in accordance with the present invention over the substrate.

After forming a MOS device with a fast metalization layer as previously described, an HD IMD film 801 is formed on the substrate in accordance with the present invention as is illustrated in FIG. 8. In the preferred embodiment, the HD IMD film 801 is deposited using a plasma-enhanced reactor such as an Applied Materials Precision 5000 system. The deposition parameters for the systems are as follows: a radio frequency (RF) field is created by a RF generator operating at about 13.56 MHz with a power output between 450 and 500 watts; the TEOS flow rate is between 400 and 600 SCCM with a desired oxygen flow rate between one and three times greater than the TEOS flow rate, and therefore, the oxygen flow rate is between 400 and 1800 SCCM; the gap between the shower head and the substrate is maintained between 180 and 200 mils; and the temperature of the reactor is between 380° C. and 410° C. The RF field is a continuous field as opposed to a pulsed field. These equipment parameters give a deposition rate of about 7000 to about 9000 Å/minute.

The HD IMD film 801 produced in accordance with the present invention has a relative HF etch rate between 1.4 and 1.7. This relative HF etch rate is lower than the relative HF etch rate of the standard IMD film which is 1.9 to 2.8. While the deposition parameters are specific for an Applied Materials Precision 5000 system, a practitioner skilled in the art is capable of adjusting a different deposition system to yield the HD IMD film 801 based upon the teachings herein.

Compared to a standard IMD film, the changed deposition parameters include increasing RF power and increasing the oxygen flow rate relative to the TEOS flow rate. The RF power is between 450 and 500 watts with the current invention compared to the prior art RF power which was 380 to 420 watts. The selection of RF power within the preferred range is determined by the state of the equipment wherein a properly maintained machine requires less RF power than an improperly maintained system (system is dirty or has some other deficiency). The actual RF power used within the preferred range can be easily determined by a practitioner skilled in the art. In the preferred embodiment, the oxygen flow rate is between one and three times higher than the TEOS flow rate which allows a more complete oxidation of TEOS compared to the prior art oxygen flow rate that is typically about half of the TEOS flow rate.

Modifications to the preferred embodiment may be made while still achieving the benefits of the current invention. All modifications hereinafter listed are used to illustrate options available to a practitioner skilled in the an and are not intended to limit the scope or spirit of the invention. Oxygen is used for the preferred embodiment since it gives a higher deposition rate of the IMD film compared to ozone, but a HD IMD film 801 may be formed using ozone instead of oxygen. Other chemicals which include nitrous oxide, ammonia, or a combination of the two may be used.

The preferred embodiment uses an oxygen flow rate up to three times higher than the TEOS flow rate. Oxygen flow rates even higher (relative to the TEOS flow rate) may be used but are not preferred because they may decrease the deposition rate of the HD IMD film 801 thereby decreasing the machine throughput. The flow rate of other chemicals may need to be adjusted to give the equivalent atomic flow rate of oxygen. Molecular oxygen ($O_2$) has two oxygen atoms for each molecule while nitrous oxide ($N_2O$) has only one oxygen atom per molecule. Therefore, the nitrous oxide flow rate must be twice as high as the oxygen flow rate to give the equivalent atomic oxygen flow rate. A nitrous oxide flow rate of two to six times the TEOS flow rate is equivalent to oxygen's flow rate of one to three times the TEOS flow rate. An ozone ($O_3$) flow rate is two-thirds to two times the TEOS flow rate. There is no known upper limit on the nitrous oxide or ozone flow rate, although decreased deposition rates similar to oxygen may occur with the higher nitrous oxide and ozone flow rates.

The system used for this invention has a continuous RF field. A pulsed RF field may be utilized and still give the desired results. The frequency and power of the RF field may need to be changed with a pulsed field although a practitioner skilled in the an should be able to adjust the system to achieve the HD IMD film 801.

Additional steps involving further depositions of HD IMD, silicon nitride, etc., or etch backs (complete or partial) involving the HD IMD film 801 or other layers subsequently deposited after the HD IMD film 801 may be done. These additional steps are typically performed for other processing concerns not related to hot electron induced device degradation due to any of the HD IMD films, and therefore, do not deviate from the scope or spirit of the invention.

Figure 9:
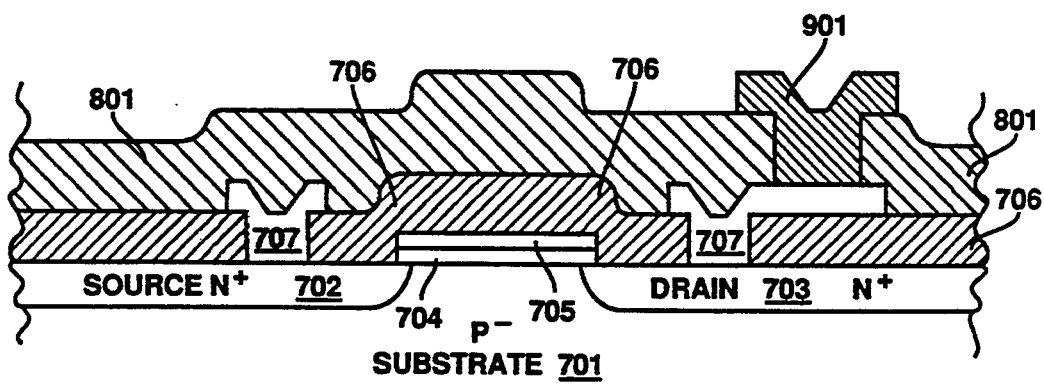
FIG. 9 shows the device of FIG. 8 after the intermetal dielectric is patterned and a second metal layer is formed at the opening in the intermetal dielectric.

Referring to the preferred embodiment, a resist layer is deposited and patterned over the HD IMD film 801 by using lithographic techniques well known in the art. An opening is etched in the HD IMD film 801 using well known etching techniques employed for etching silicon dioxide, silicon oxynitride, or silicon nitride layers, so that an second metalization layer 901 may contact the first metalization layer at the predetermined location as illustrated in FIG. 9. The second metalization layer 901 may use the same or different materials as the first metalization layer 707. Some devices may require additional metalization layers with HD IMD films between them. All of the HD IMD films may be made in accordance with the present invention. Following the formation of the last metalization layer, the devices are further processed to give finished devices. The formation of all of the metalization layers and processing step following the formation of the last metalization layer are well known in the art.

The invention has been described in conjunction with MOS devices. The benefits of the invention may be achieved with other semiconductor devices such as bipolar devices. The invention should be utilized when a high density, relatively conformal, plasma-enhanced TEOS-based dielectric is desired.

The method the present invention forms a more conformal, undoped plasma-enhanced TEOS-based IMD film by using greater RF power and a higher oxygen to TEOS flow rate yielding a high density IMD film that has a reduced water absorbance rate than a standard IMD film. Therefore, a device with less hot electron induced degradation is achieved with this invention.

Thus, a method of forming a HD IMD film with a substantially reduced water absorbance rate thereby producing a device which has less hot electron induced degradation has been described.

We claim:

1. A method of forming a semiconductor device which comprises the steps of:
    (a) providing a substrate with a first interconnection metal layer;
    (b) forming a dielectric layer directly on said first interconnection layer, said dielectric layer being formed by a method including using a plasma-enhanced reaction, said reaction being performed at a radio frequency of approximately 13.56 MHz, with a flow rate of an oxygen containing chemical and a flow rate of tetraethyl orthosilicate (TEOS) such that an equivalent atomic flow rate of oxygen in said oxygen containing chemical on a mole basis is between two times said flow rate of TEOS on a mole basis and about six times said flow rate of TEOS on a mole basis; and
    (c) forming a second interconnection layer directly on said dielectric layer produced by said method, said dielectric layer produced by said method being the sole dielectric layer separating said second interconnection layer from said first interconnection metal layer.

2. The method of claim 1 wherein said oxygen containing chemical is selected from the group consisting of oxygen, ozone, nitrous oxide, and any combination thereof.

3. The method of claim 2 wherein said TEOS flow rate is between about 400 and about 600 SCCM and said oxygen flow rate is between about 400 and about 1800 SCCM.

4. The method of claim 2 wherein said TEOS flow rate is between about 400 and about 600 SCCM and said ozone flow rate is between about 266 and about 1200 SCCM.

5. The method of claim 2 wherein said TEOS flow rate is between about 400 and about 600 SCCM and said nitrous oxide flow rate is between about 800 and about 3600 SCCM.

6. The method of claim 1 wherein said reaction takes place at an RF power, said RF power being between about 450 watts and about 500 watts.

7. The method of claim 1 wherein said dielectric has an HF etch rate between about 1.4 and about 1.7 times greater than an HF etch rate of silicon dioxide thermally grown from monocrystalline silicon.

8. A method of forming a semiconductor device, including a PECVD oxide layer as an IMD, wherein said method comprises the steps of:
    (a) providing a substrate with a first interconnection metal layer;
    (b) forming a dielectric layer directly on said first interconnection metal layer, said dielectric layer being formed by a method including using a plasma-enhanced reaction including a combination of a flow rate of an oxygen containing chemical and a flow rate of TEOS such that an equivalent atomic flow rate of oxygen in said oxygen containing chemical on a mole basis is between two times said flow rate of TEOS on a mole basis and about six times said flow rate of TEOS on a mole basis, said reaction being performed at a radio frequency of approximately 13.56 MHz and at an RF power; and
    (c) forming a second interconnection layer directly on said dielectric layer, said dielectric layer produced by said method and being the sole dielectric layer separating said second interconnection layer from said first interconnection metal layer.

9. The method of claim 8 wherein said oxygen containing chemical is selected from the group consisting of oxygen, ozone, nitrous oxide, and any combination thereof.

10. The method of claim 9 wherein said TEOS flow rate is between about 400 and about 600 SCCM and said oxygen flow rate is between about 400 and about 1800 SCCM.

11. The method of claim 9 wherein said TEOS flow rate is between about 400 and about 600 SCCM and said ozone flow rate is between about 266 and about 1200 SCCM.

12. The method of claim 9 wherein said TEOS flow rate is between about 400 and about 600 SCCM and said nitrous oxide flow rate is between about 800 and about 3600 SCCM.

13. The method of claim 10 wherein said dielectric has an HF etch rate between about 1.4 and about 1.7 times greater than an HF etch rate of silicon dioxide thermally grown from monocrystalline silicon.

* * * * *

UNITED STATES PATENT AND TRADEMARK OFFICE
CERTIFICATE OF CORRECTION

PATENT NO. : 5,389,581
DATED : February 14, 1995
INVENTOR(S) : Philip Freiberger, et al It is certified that error appears in the above-indentified patent and that said Letters Patent is hereby corrected as shown below:

Column 2, Line 22,    Delete "comers"    Insert in place thereof --corners--

Column 6, Line 14,    Delete "an"    Insert in place thereof --art--

Column 6, Line 46,    Delete "an"    Insert in place thereof --art--

Column 8, Line 33,    Delete "and"

Signed and Sealed this

Seventeenth Day of October, 1995

BRUCE LEHMAN

*Attest:*

*Attesting Officer*    *Commissioner of Patents and Trademarks*